(12) United States Patent
Rangelow et al.

(10) Patent No.: US 11,798,987 B2
(45) Date of Patent: Oct. 24, 2023

(54) SUBSTRATE FOR A CONTROLLED IMPLANTATION OF IONS AND METHOD OF PREPARING A SUBSTRATE FOR A CONTROLLED IMPLANTATION OF IONS

(71) Applicant: PARCAN NANOTECH CO., LTD., Shanghai (CN)

(72) Inventors: Ivo Rangelow, Baunatal (DE); Xiang-Qian Zhou, Nashan District-Shenzhen (CN); Dimitre Karpuzov, Woodstock (CA)

(73) Assignee: PARCAN NANOTECH CO., LTD., Shanghai (CN)

( * ) Notice: Subject to any disclaimer, the term of this patent is extended or adjusted under 35 U.S.C. 154(b) by 203 days.

(21) Appl. No.: 17/421,379

(22) PCT Filed: Jan. 8, 2020

(86) PCT No.: PCT/IB2020/020004
§ 371 (c)(1),
(2) Date: Jul. 8, 2021

(87) PCT Pub. No.: WO2020/144543
PCT Pub. Date: Jul. 16, 2020

(65) Prior Publication Data
US 2022/0069080 A1 Mar. 3, 2022

(30) Foreign Application Priority Data
Jan. 8, 2019 (DE) .......................... 102019100312.1

(51) Int. Cl.
*H01L 29/06* (2006.01)
*H01L 21/265* (2006.01)
(Continued)

(52) U.S. Cl.
CPC ........ *H01L 29/0657* (2013.01); *H01L 21/266* (2013.01); *H01L 21/26506* (2013.01);
(Continued)

(58) Field of Classification Search
CPC ........... H01L 29/0657; H01L 21/26506; H01L 21/266; H01L 29/1602; H01L 29/6603;
(Continued)

(56) References Cited

U.S. PATENT DOCUMENTS 4,224,733 A * 9/1980 Spadea ........... H01L 21/823857
257/E21.639
9,514,916 B2 * 12/2016 Citver ................. H01J 37/3171
(Continued)

FOREIGN PATENT DOCUMENTS

AU 2005242730 B2 11/2011
CN 103778391 A 5/2014
(Continued)

OTHER PUBLICATIONS

Extended European Search Report in related European Patent Application No. 20738423.1, dated Jul. 25, 2022, 9 pages.
(Continued)

*Primary Examiner* — Yasser A Abdelaziez
(74) *Attorney, Agent, or Firm* — Bochner PLLC; Andrew D. Bochner (57) ABSTRACT

The present invention is related to a substrate (10) for a controlled implantation of ions (80) into a bulk (20), the substrate (10) comprising the bulk (20) composed of a crystalline first material (70), the bulk (20) comprising an implantation region (28) and a surface (22), wherein the implantation region (28) is located within the bulk (20) and along an implantation direction (82) at an implantation depth (26) below an implantation area (24) on the surface (10) of the bulk (20). Further, the present invention is related to a (Continued)

method of preparing a substrate (10) for a controlled implantation of ions (80) into a bulk (20), preferably the aforementioned substrate (10), the substrate (10) comprising the bulk (20) composed of a crystalline first material (70), the bulk (20) comprising an implantation region (28) and the surface (22), wherein the implantation region (28) is located within the bulk (20) and along an implantation direction (82) at an implantation depth (26) below an implantation area (24) on the surface (22) of the bulk (20).

18 Claims, 8 Drawing Sheets

(51) Int. Cl.
| | | |
|---|---|---|
| *H01L 21/266* | (2006.01) | |
| *H01L 29/16* | (2006.01) | |
| *H01L 29/66* | (2006.01) | |
| *H01L 29/861* | (2006.01) | |
| *H01L 29/868* | (2006.01) | |

(52) U.S. Cl.
CPC ...... *H01L 29/1602* (2013.01); *H01L 29/6603* (2013.01); *H01L 29/6609* (2013.01); *H01L 29/66136* (2013.01); *H01L 29/868* (2013.01); *H01L 29/8611* (2013.01); *H01L 2021/26573* (2013.01)

(58) Field of Classification Search
CPC ........... H01L 29/6609; H01L 29/66136; H01L 29/8611; H01L 29/868; H01L 2021/26573; H01L 21/26513; H01L 21/26593; H01L 21/0415; H01L 21/26586
See application file for complete search history.

(56) References Cited

U.S. PATENT DOCUMENTS

| | | |
|---|---|---|
| 2004/0241950 A1 | 12/2004 | Olofsson |
| 2006/0270071 A1 | 11/2006 | Chang |
| 2008/0073570 A1 | 3/2008 | Chen |
| 2017/0345750 A1* | 11/2017 | Tsuboi ................ H01L 29/6653 |

FOREIGN PATENT DOCUMENTS

| | | |
|---|---|---|
| CN | 105206510 A | 12/2015 |
| CN | 108666210 A | 10/2018 |

OTHER PUBLICATIONS

Taur, Y.; Ning t. H.: Fundaments of Modern VLSI Devices. vol. 1, Cambridge: Univ. press, 1998, ISBN 0-521-55959-6, 7 pages.

Rubin, L. M.; Morris, W.; Jasper, C.: Process control issues for retrograde well implants for narrow n+/p+ isolation in CMOS. In: Proceedings of the 14th International Conference on ION Implantation Technology, 2002, 4 pages.

Written Opinion of the International Searching Authority in International Appl. No. PCT/IB2020/020004, dated May 28, 2020, 4 pages.

International Search Report in International Appl. No. PCT/IB2020/020004, dated May 28, 2020, 2 pages.

* cited by examiner

SUBSTRATE FOR A CONTROLLED IMPLANTATION OF IONS AND METHOD OF PREPARING A SUBSTRATE FOR A CONTROLLED IMPLANTATION OF IONS

The present invention relates to a substrate for a controlled implantation of ions into a bulk, the substrate comprising the bulk composed of a crystalline first material, the bulk comprising an implantation region and a surface, wherein the implantation region is located within the bulk and along an implantation direction at an implantation depth below an implantation area on the surface of the bulk. Further, the present invention relates to a method for preparing a substrate for a controlled implantation of ions into a bulk, preferably an aforementioned substrate, the substrate comprising the bulk composed of a crystalline first material, the bulk comprising an implantation region and a surface, wherein the implantation region is located within the bulk and along an implantation direction at an implantation depth below an implantation area on the surface of the bulk.

An implantation of ions is a known procedure for instance for doping semiconductors. Especially, single ion implantation is one of the main candidates of creating qubits of single donors for large scale quantum processing in silicon. Unfortunately, due to the statistical nature of particle 3D propagation in crystalline and amorphous media, a final position of the particle at rest could be well displaced laterally. Therefore, a precise impact positioning of the implanted ions especially of implanted single ions, is hard to achieve, thus diminishing the net effect of such single ion implantation. More so, as it is well-known, crystalline materials exhibit open channels and planes, along which particles, especially implanted ions, can propagate further in depth as well as laterally depending on channel orientation.

In view of the above, it is an objective of the present invention to provide a substrate and a method for controlled implantation of ions which do not have the aforementioned drawbacks of the state of the art. It is especially the object of the present invention to provide a substrate and a method for a controlled implantation of ions into a bulk, which allow a precise localization of the implanted ions in the bulk in an easy, cost-efficient and especially reproducible way.

This object is satisfied by the patent claims. In particular, this object is satisfied by a substrate for a controlled implantation of ions into a bulk according to claim 1 and by a method for preparing a substrate for a controlled implantation of ions into a bulk according to claim 15. The dependent claims describe preferred embodiments of the invention. Details and advantages described in respect of a substrate according to the first aspect of the invention are also referred to a method according to the second aspect of the invention and vice versa, if of technical sense.

According to a first aspect of the invention, the object is satisfied by a substrate for a controlled implantation of ions into a bulk, the substrate comprising the bulk composed of a crystalline first material, the bulk comprising an implantation region and a surface, wherein the implantation region is located within the bulk and along an implantation direction at an implantation depth below an implantation area on the surface of the bulk. A substrate according to the invention is characterized in that the substrate further comprise a pillar composed of the first material located at the implantation area and extending opposed to the implantation direction away from the surface of the bulk, and wherein the pillar is surrounded perpendicular to the implantation direction by a buffer layer composed of a second material, the buffer layer covering the surface of the bulk and the sides of the pillar.

A substrate according to the invention comprises as a main element a bulk composed of a crystalline first material. Within this bulk, an implantation region is defined, whereto the ions should be implanted in a subsequent implantation procedure above the implantation region. With respect to an implantation direction of the ions to be implanted an implantation area is defined on the surface of the bulk. In other words, during the implantation procedures, the ions enter the bulk through the implantation area on the surface of the bulk, propagate through the crystalline first material of the bulk and, if everything works out, come to rest within the implantation region.

To ensure the above-mentioned implantation of the ions into the implantation region, a substrate according to the invention comprises special features. First off, the substrate further comprises a pillar in addition to the bulk, the pillar also being composed of the first material. This pillar is located on the surface of the bulk, located at the implantation area, and extends opposed to the implantation direction away from the surface of the bulk. Additionally to the pillars, a buffer layer is comprised also on the surface of the bulk, essentially covering the surface of the bulk and the sides of the pillar. In other words, the pillar is surrounded by the buffer layer perpendicular to the implantation direction, wherein preferably the buffer layer is in direct contact to the sides of the pillar. Preferably the buffer layer covers the entire surface of the bulk free of pillars and additional elements, as for instance electric contacts, support structures and similar items.

As the pillar extends along the implantation direction, ions to be implanted into the implantation region have to propagate through the whole pillar along the implantation direction to reach the implantation area at the surface of the bulk and further on to enter the bulk and propagate to their intended rest position in the implantation region. As the pillar also comprises the first crystalline material, the pillar automatically comprises a crystal structure similar to that of the bulk. This means that such a crystalline material comprises open channels and planes, along which particles, especially ions, will propagate further in depth as well as laterally dependent on channel orientation. Essentially, most of these ions, preferably all of the ions, which propagate through the whole pillar along the implantation direction, are well-channelled ions along such a crystal channel and/or crystal plane. As the pillar and the bulk are composed of the same crystalline first material, also this crystal channel and/or plane can be present identically both in the pillar and the bulk, respectively. Therefore, these channelled ions in the pillar can continue their propagation in the bulk also as channelled ions, channelled in crystal channels and/or planes along the implantation direction. On travelling through the material of the pillar and the bulk, the ions loose kinetic energy, and at a late stage of their propagation, i.e. when they have lost most of their kinetic energy, they will leave the respective channel and/or plane and will be completely stopped in the vicinity of the channel and/or plane. Therefore, by using the pillars for an implantation of the ions into the implantation region in the bulk, a high lateral positional accuracy can be achieved. An implantation depth can be controlled by an accordingly adapted kinetic energy of the implanted ions. A controlled implantation of ions into a designated implantation region within a bulk can therefore be achieved.

In the paragraph above, only ions are described, which travel in a channelled manner through the pillar and the bulk along the implantation direction. Nevertheless, when entering the pillar, also propagation directions of the ions different to the implantation direction are possible. For instance, the ions can just be scattered on atoms of the first material of the pillar in random directions. Additionally, the ions can also enter crystal channels and/or planes, which are not aligned with respect to the implantation direction. In all of these cases, the ions will scatter away from the implantation direction and sooner or later leave the pillar through its sides. In other words, these ions will then enter the buffer layer composed of the second material. Preferably, these ions are subsequently stopped within the buffer layer before reaching the bulk.

In summary, using a substrate according to the invention, the implantation of ions into a bulk can be improved by comprising a pillar structure on top of the bulk, with the pillar being composed of the same crystalline first material as the bulk and being surrounded by a buffer layer composed of a second material. The pillar extends along the desired implantation direction and preferably only ions channelled through the whole pillar can and will enter the bulk and propagate further into the implantation region. All other ions scattered away from the implantation direction, enter the buffer layer through the sides of the pillar and are stopped within the buffer layer. In other words, these scattered ions do not reach the bulk and therefore are not implanted into the bulk. A controlled implantation of ions into an implantation region within a bulk can therefore be provided with a high lateral positional accuracy.

Further, a substrate according to the invention can be characterized in that an irridiation surface of the pillar is not covered by the buffer layer, the irridiation surface being located at an end of the pillar opposed to the bulk in respect of the implantation region, preferably wherein the irridiation surface is spaced away from the buffer layer, optionally wherein a height of the pillar along the implantation direction is at least of the same size as a thickness of the buffer layer measured along the implantation direction. In this way one can ensure that only first material is provided in the desired implantation path along the implantation direction. An interaction of the ions to be implanted with materials other than the crystalline first material, especially with the second material, can be avoided. By spacing away the irridiation surface from the buffer layer, one can ensure that no second material of the buffer layer reaches the irridiation surface. In an embodiment with a height of the pillar along the implantation direction of at least of the same size as a thickness of the buffer layer along the implantation direction, a free irridiation surface not covered by the buffer layer can be provided especially easily.

Preferably, a substrate according to the invention can be characterized in that a crystal structure of the first material in the bulk continues in the pillar. In other words, there is no jump in crystal structures between the crystal structure of the pillar and the crystal structure of the bulk at the base of the pillar located at the implantation area on the surface of the bulk. Especially, crystal channels and/or planes present in the pillar, preferably along the implantation direction, continue without jumps and/or interruptions in the bulk. Implanted ions, channelled along such a crystal channel and/or plane in the pillar, can therefore smoothly enter the bulk and continue their propagation through the bulk well channelled into the implantation region.

Further, a substrate according to the invention can be characterized in that the substrate comprises a plurality of pillars accordingly placed in respect of a plurality of implantation regions, in particular identical pillars, preferably wherein the plurality of pillars is arranged in an array, optionally with a height of each pillar of the plurality of pillars is the same. With a plurality of pillars, an implantation of ions at several places, especially into several implantation regions, can be provided, each single of them with high lateral position accuracy. All advantages described above can be provided for each single implantation event through one of these pillars of the plurality of pillars. An array of pillars can preferably comprise pillars and/or implantation regions repeatedly arranged in lines and/or columns. Such an array of pillars and implantation regions may be separated afterwards. If all pillars are of the same height, a production of the substrate according to the invention can be simplified.

Additionally, a substrate according to the invention can be characterized in that the first material is different from the second material. This especially allows a better adaptation of the two materials to the desired implantation reaction. The first material is the material the ions are subsequently implanted into, for instance a crystalline semiconductor. The second material can be chosen according to its stopping power in respect of the used ions to ensure that all ions scattered out of the pillar are stopped within the buffer layer.

Especially, a substrate according to the invention can be characterized in that the first material is a crystalline semiconductor, preferably silicon or diamond-like carbon. With a substrate according to the invention as described above, also single ion implantation can be achieved, especially with a high lateral position accuracy of the implanted single ion. Production of qubits can therefore be provided or at least considerably improved.

Further, a substrate according to the invention can be characterized in that the second material is an amorphous material, especially an oxide or a nitride, preferably a polycrystalline version of the first material. Such an amorphous material has an especially high stopping power for the ions scattered into the buffer layer. Especially, an amorphous material does not comprise far reaching crystal channels and/or planes and therefore ions travelling along such a crystal channel and/or plane in the pillar with a direction different to the implantation direction, enter the buffer layer out of amorphous material and are easily and effectively stopped. Oxides or nitrides, preferably a polycrystalline version of the first material, are especially easy to handle and to grow on top of the surface of the bulk.

Further, a substrate according to the invention can be characterized that the implantation area covers less than $1\times1$ µm$^2$, in particular less than $100\times100$ nm$^2$, preferably $7\times7$ nm$^2$. Small implantation areas allow to place a plurality of implantation regions at a relatively small area, the smaller the implantation area, the more implantation regions are possible per unit area. A miniaturization of the produced structures with implanted ions can therefore be improved.

Additionally, a substrate according to the invention can be characterized in that a cross section of the pillar perpendicular to the implantation direction is larger than the implantation area, especially twice as large as the implantation area, preferably 10 times as large as the implantation area. By a cross section of the pillar perpendicular to the implantation direction larger than the implantation area, a complete covering of the implantation area by the pillar can be easily provided. A probability of missing the pillar during the implantation process and therefore losing all of the advantages described above can be minimized.

Preferably, a substrate according to the invention can be characterized in that an axis of the pillar is collinear or at least essentially collinear to the implantation direction. In other words, the pillar is centered on the implantation direction. In this way one can ensure that ions have to travel through the whole pillar to reach the implantation area on the surface of the bulk and subsequent the implantation region within the bulk.

Further, a substrate according to the invention can be characterized in that a height of the pillar along the implantation direction is chosen to be adapted to at least one of the following items:
  first material
  implantation depth
  second material
  material of the ions to be implanted
  kinetic energy of the ions to be implanted
  charge state of the ions to be implanted
  mass ratio of the ions to be implanted to the first and/or second material.

In summary, a height of the pillar along the implantation direction is preferably chosen such that a propagation through the whole pillar along the implantation direction has a high probability that a respective crystal channel and/or plane in the pillar is used by the propagated ion and that all other ions scattered away from the implantation direction leave the pillar through its sides into the buffer layer made of the second material and are stopped within the buffer layer.

If the first material has a high stopping power for the ions to be implanted, a smaller height of the pillar is chosen as in cases when the stopping power of the first material is lower. Alternatively an energy of the ions to be implanted can be increased or reduced in dependence on the height of the pillar or of the ions to be implanted or of features of the substrate.

The same is valid for the stopping power of the second material in respective the ions to be implanted, a high stopping power of the second material allows a smaller height of the pillar, a low stopping power demands for a larger height of the pillar and a respective larger thickness of the buffer layer.

As for the mass and the kinetic energy of the ions to be implanted, a high mass and a high kinetic energy allow the ions to be implanted to propagate further within the first material and therefore the height of the pillar can be larger, low mass and/or low kinetic energy ions demand for a shorter height of the pillar.

As the charge state of the ions to be implanted directly influences the stopping power, a high charge state of the ions to be implanted can be adapted by a shorter height of the pillar, a lower charge state can allow larger heights of pillars. In respect of a mass ratio of the ions to be implanted to the first and/or second material, if this mass ratio is higher, a larger height, if it is smaller, a shorter height of the pillar can be used.

Further, the substrate according to the invention can be characterized in that at least one electric contact is connected to the bulk to register an implantation of an ion into the implantation region. Such a registration of an implantation of an ion can essentially allow a single ion implantation into the implantation region of the bulk. Such a single ion can be stopped anywhere within a substrate according to the invention, wherein providing at least one electric contact allows the registration of a correct implantation within the implantation region. Preferably, three electric contacts are used to register an implantation of an ion into the monitored implantation region. After such a registration of a correct implantation the implantation procedure can be stopped, especially without the need of a dependence on probabilistic approaches.

According to a preferred embodiment of a substrate according to the invention the substrate can be characterized in that at least one ion, preferably a single ion, is implanted along the implantation direction through the pillar into the implantation region. In other words, this is a controlled implantation of ions into the implantation region. Especially a single ion implantation into the implantation region can be provided.

Further, a substrate according to the invention can be improved in that the pillar and/or the buffer layer is removed from the surface of the bulk. In other words, only the bulk with the controlled implanted ions in precisely defined implantation regions are present in this embodiment of a substrate according to the invention. Especially, a bulk with implanted single ions with high lateral position accuracy can be provided.

According to a second aspect of the invention the object is solved by a method of preparing a substrate for a controlled implantation of ions into a bulk, preferably the substrate according to the first aspect of the invention, the substrate comprising the bulk composed of a crystalline first material, the bulk comprising an implantation region and a surface, wherein the implantation region is located within the bulk and along an implantation direction at an implantation depth below an implantation area on the surface of the bulk. A method according to the second aspect of the invention is characterized by the following steps:
  a) providing the bulk composed of the first material;
  b) forming a pillar of the first material located at the implantation area on the surface of the bulk provided in step a) and extending opposed to the implantation direction away from the surface of the bulk; and
  c) surrounding the pillar provided in step b) perpendicular to the implantation direction by a buffer layer composed of a second material, the buffer layer essentially covering the surface of the bulk and the sides of the pillar.

A method for preparing a substrate according to the second aspect of the invention can preferably be used to prepare and provide a substrate according to the first aspect of the invention. All advantages described with respect to a substrate according to the first aspect of the invention can therefore also be provided by a method for preparing a substrate for a controlled implantation of ions into a bulk according to the second aspect of the invention.

In a first step a) of a method according to the invention, a bulk composed of the first material is provided. The bulk is especially the part of the substrate prepared by a method according to the invention, in which the ions will subsequently be implanted. Therefore within the bulk at least one implantation region is defined, wherein on a surface of the bulk, in respect of an implantation direction above the implantation region, an implantation area is located.

In the second step b) of a method according to the invention a pillar is formed on this implantation area. This pillar is composed of the first material, identical to the bulk, and preferably a crystal structure of the bulk continues into the pillar. The bulk is located at the implantation area on the surface of the bulk and extends opposed to the desired implantation direction away from the surface of the bulk.

In the last step c) of a method according to the invention, the pillar formed in step b) is surrounded perpendicular to the implantation direction by a buffer layer. This buffer layer essentially covers the surface of the bulk and the sides of the pillar. The buffer layer is composed of a second material, preferably a second material different to the first material.

In summary, a method for preparing a substrate for a controlled implantation of ions into a bulk can provide a substrate, which allows an implantation of ions into the implantation region with high lateral position accuracy. Essentially, ions can be implanted through the pillar into the bulk and finally into the implantation region, wherein ions scattered away from the implantation direction in the pillar leave the pillar through its sides and enter the buffer layer and are subsequently stopped within the buffer layer. Preferably, only well-channelled ions, in particular ions guided by crystal channels and/or planes, propagate through the pillar along the implantation direction, enter the bulk at the implantation area and travel further until they reach the implantation region. A kinetic energy of the ions to be implanted can be chosen such that an implantation depth, the distance between the surface and implantation region, can be adhered to.

Additionally, all steps and advantages described above can also be reached for a plurality of implantation regions within the bulk, wherein in step b) of the method according to the invention for each of these implantation regions a respective pillar is formed at the respective implantation area on the surface of the bulk.

Further, a method according to the invention can be improved by that step b) includes an etching process to form the pillar. Etching processes are an especially easy way to form structures on the surface of a bulk, especially of a bulk made of a crystalline semiconductor. Further, by etching the pillars out of bulk material, it can be easily ensured that the crystal structure of the bulk continues in the pillars.

Preferably, a method according to the invention can be characterized in that after step c) an additional step d) is carried out, wherein step d) comprises an implantation of at least one ion into the substrate along the implantation direction through the pillar into the implantation region. Referring to the above-mentioned advantages, especially of a substrate according to the first aspect of the invention, such an implantation through the pillar along the implantation direction allows an especially controlled implantation of ions into the bulk. Only ions propagating through the complete pillar, especially guided along a crystal channel and/or plane, can reach the bulk and subsequently the implantation region within the bulk. Also single ion implantation can provided. All other ions, scattered within the pillar away from the implantation direction, enter the buffer layer through the sides of the pillar and are stopped within the buffer layer.

A method according to the invention can be improved further by that after step d) an additional step e) is carried out, wherein step e) comprises removing the buffer layer and the pillar. As a result, a bulk with controlled implanted ions, especially single ions, can be provided. All ions scattered away from the implantation direction and stopped within the buffer layer are removed. Preferably, only implanted ions, especially a single ion, in the implantation region remain in the bulk after carrying out step e) of a method according to the invention.

In another improvement of a method according to the invention the method can be characterized in that step d) includes a cooling of the substrate to a temperature of at least 77° K, preferably of at least 4° K. By lowering the temperature of the substrate during the implantation of the ions, an internal movement of the atoms of the first material of the bulk is reduced. In this way one can raise the number of ions reaching the implantation region. In other words, the probability of a successful single ion implantation into the implantation region can be improved.

Further, a method according to the invention can be improved by that step d) includes registering the implantation of ions, preferably of a single ion, into the implantation region. Such a registration of a successful implantation of ions into the implantation region allows stopping the implantation procedure after a successful implantation of ions into the implantation region. Especially, also single ion implantations into the implantation region can be registered. A production of qubits can therefore be improved.

The present invention is further described hereinafter with reference to illustrated embodiments shown in the accompanying drawings.

There is shown:

FIG. 5 3D projections of implantation reactions,

Elements of the same function are specified throughout the figures with the same reference signs. In the following, any statement made having regard to the direction of a component is made relative to the position shown in the drawing and can naturally vary in the actual position. The description of the accompanying drawings is only by the way of detail. Specific features of each aspect of the present invention and of the figures can be combined which each other if of technical sense.

Figure 1:
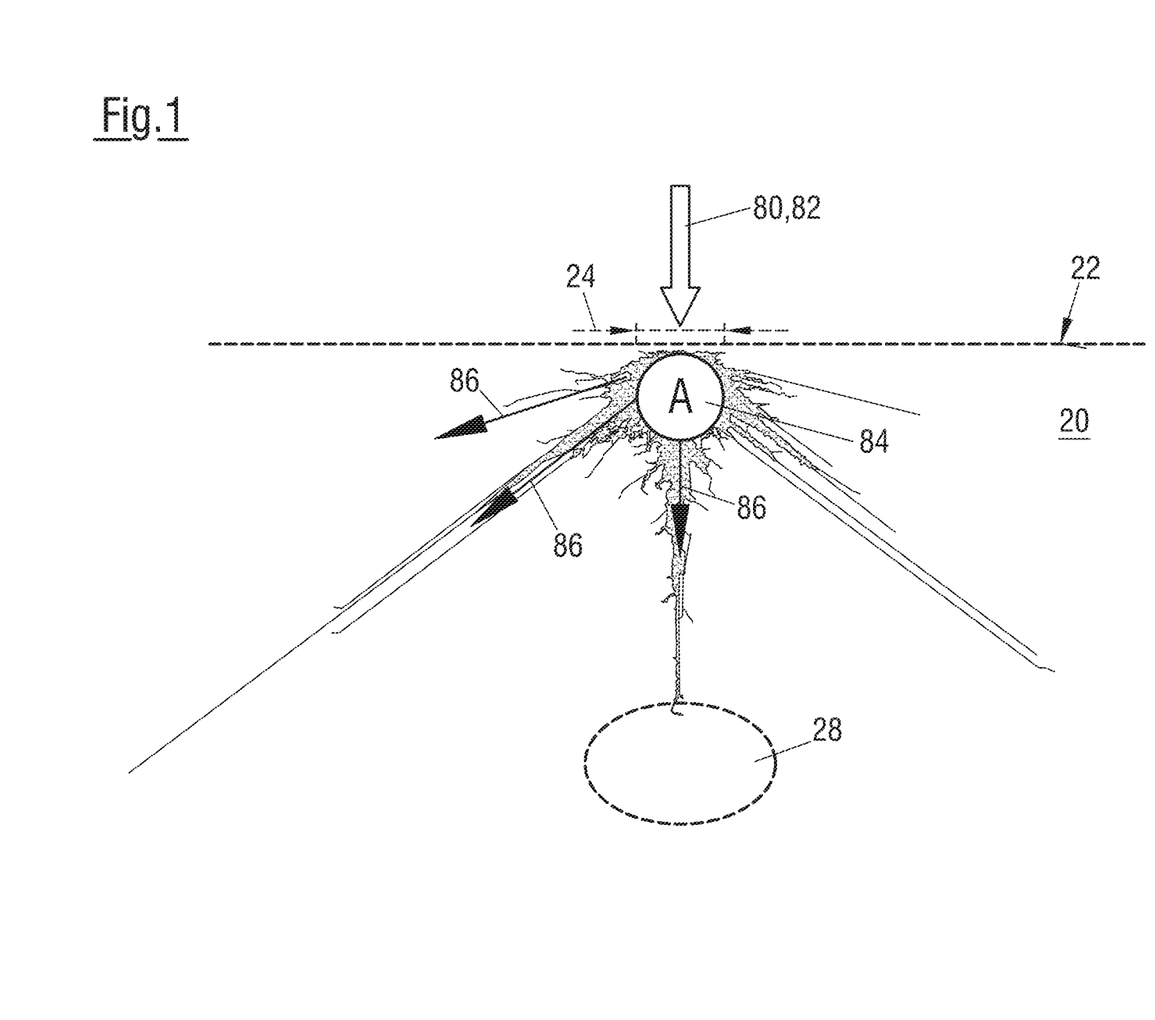
FIG. 1 an implantation of ions into a bulk.

FIG. 1 shows an implantation reaction of ions 80 directly into a bulk 20. The ions 80 impinge directly along an implantation direction 82 onto an implantation area 24 on the surface 22 of the bulk 22. Immediately after entering the bulk 20, especially in an impact region 84, the ions 80 interact with the material of the bulk 20 and can be scattered into different propagation directions 86. It is clearly visible that only a small fraction of the ions 80 propagate within the bulk 20 along the desired implantation direction 82 in direction to the implantation region 28. Especially if the bulk 20 is made out of a crystalline material, the ions 80 can enter crystal channels and/or planes and travel far within the bulk 20, especially also in lateral directions. Therefore the lateral spread of the implanted ions 80 can be as large as depicted in FIG. 1.

Figure 2:
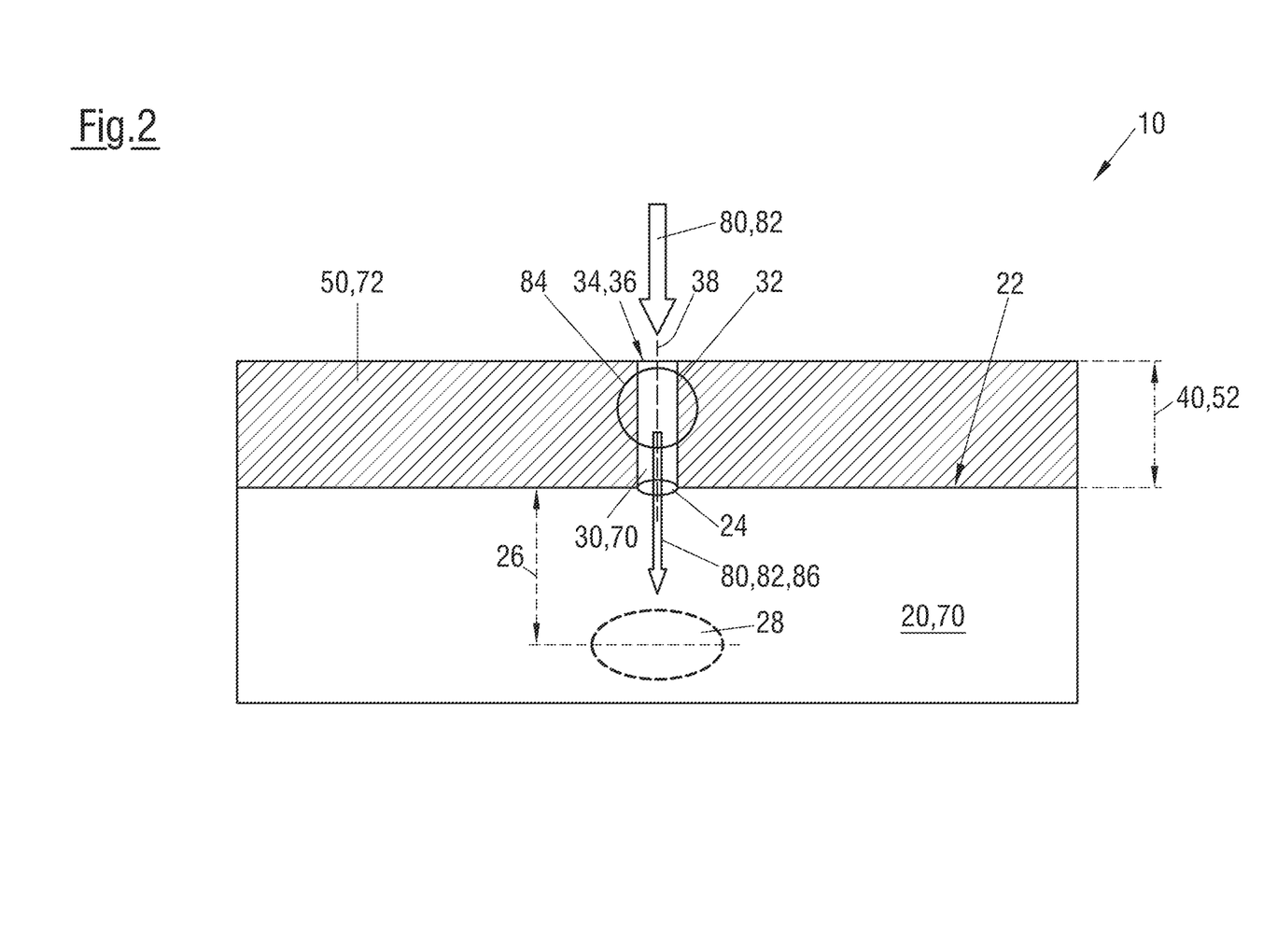
FIG. 2 a substrate according to the invention.

In FIG. 2 a substrate 10 according to the invention, especially a substrate 10 prepared by a method according to the invention, is shown. At the bottom of the substrate 10, again the bulk 20, composed out of a first material 70, is located. On top of a surface 22 of the bulk 20, two additional elements of a substrate 10 according to the invention are provided. Preferably collinear to an implantation direction 82 of ions 80 to be implanted, a pillar 30 is placed on top of the implantation area 24 and extending opposed to the implantation direction 82 away from the surface 22 of the bulk 20. The pillar 30 is composed of the first material 70 and can preferably be formed out of material of the bulk 20 using an etching process. Surrounding the sides 32 of the pillar 30 and essentially covering the surface 22 of the bulk 20, a buffer layer 50 composed of a second material 72 is provided.

Preferably, the first material 70 and the second material 72 are different. For instance, crystalline silicon or diamond-like carbon can be used as first material 70, an amorphous material like an oxide or nitride as second material 72.

In this embodiment, the height 40 of the pillar 30 is equal to a thickness 52 of the buffer layer 50, ensuring that an irridation surface 36 on an end 34 of the pillar 30 opposed to the surface 22 of the bulk 20 in respect of the implantation direction 82 stays uncovered of the buffer layer 50. This allows ions 80 to enter the pillar 30 along the implantation direction 82 through the irridation surface 36, travel through the initial impact region 84 along the axis 38 of the pillar 30 and finally reaching the bulk 20 and the implantation region 28 located in an implantation depth 26 below the surface 22 of the bulk 20. Possible sizes of the implantation area 24 can be as small as 7×7 nm². Further, a substrate 10 according to the invention can also comprise a plurality of implantation regions 28 and a plurality of respectively arranged pillars 30. Additionally, the pillars 30 can comprise a cross-section perpendicular to the implantation direction 82 larger than the respective implantation area 24.

Figure 3:
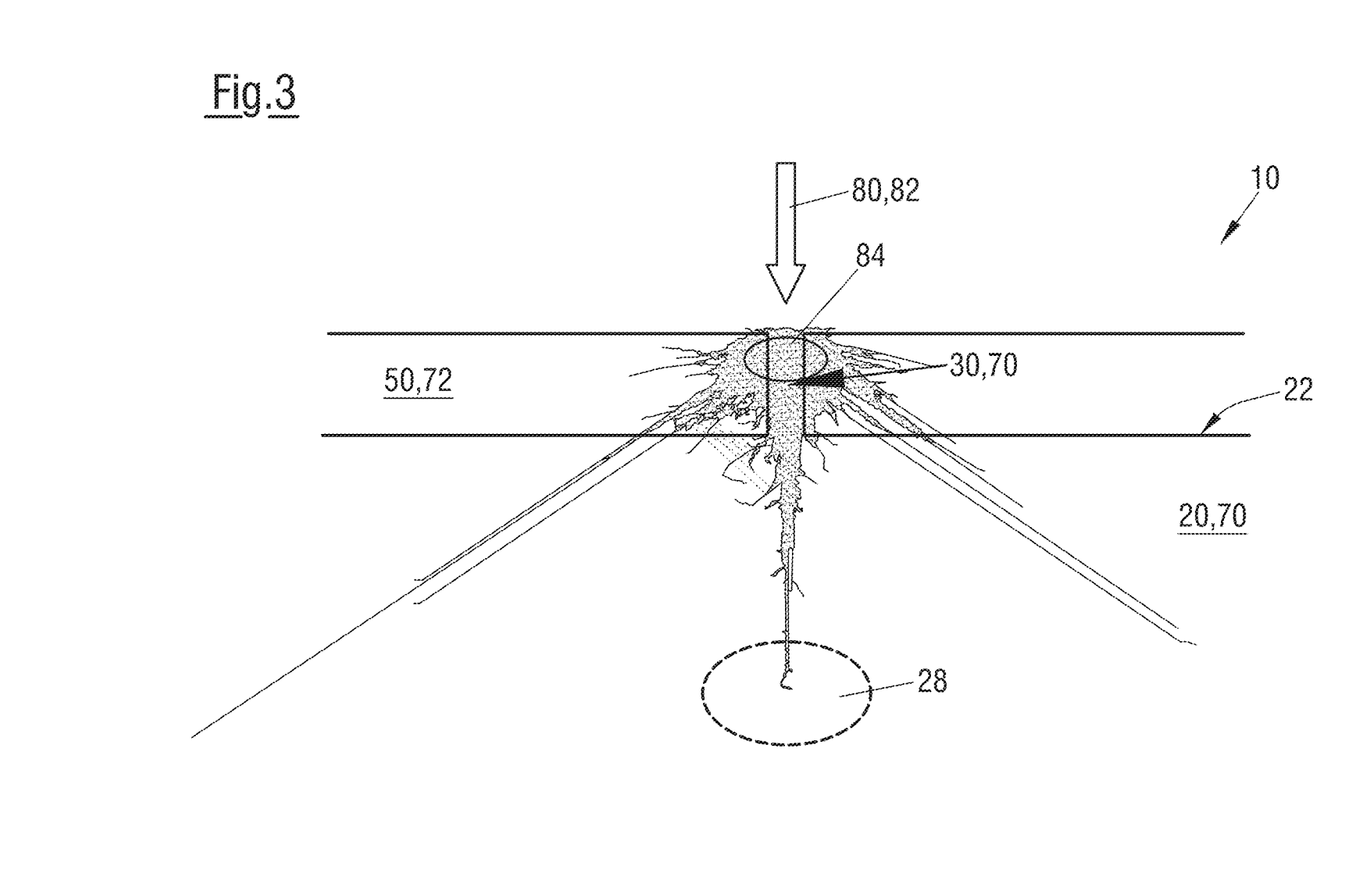
FIG. 3 another embodiment of a substrate according to the invention.

FIG. 3 essentially shows the advantages of a substrate 10 according to the invention. In FIG. 3, the impact of the ions 80 already shown in FIG. 1 is superimposed onto a schematic view of a substrate 10 according to the invention. Only basic elements of the substrate 10 are shown, namely the bulk 20 composed of the first material 70, the buffer layer 50 composed of the second material 72, the pillar 30 also composed of the first material 70 and the implantation region 28 within the bulk 20. It is clearly visible that the impact region 84 is positioned at the beginning of the pillar 30, the pillar 30 surrounded by the second material 72 of the buffer layer 50.

The scattering of the ions 80 away from the implantation direction 82 is therefore located well above the surface 22 of the bulk 20. The scattered ions 80 enter the buffer layer 50 and are essentially stopped within the buffer layer 50, not shown in this simple superimposition of the two figures. Nevertheless, only ions 80 channelled along crystal channels and/or planes which are at least essentially aligned with the implantation direction 82 can enter the bulk 20 and afterwards reach the implantation region 28. An implantation of ions 80 into the implantation region 28 can therefore be provided with high lateral position accuracy.

Figure 4:
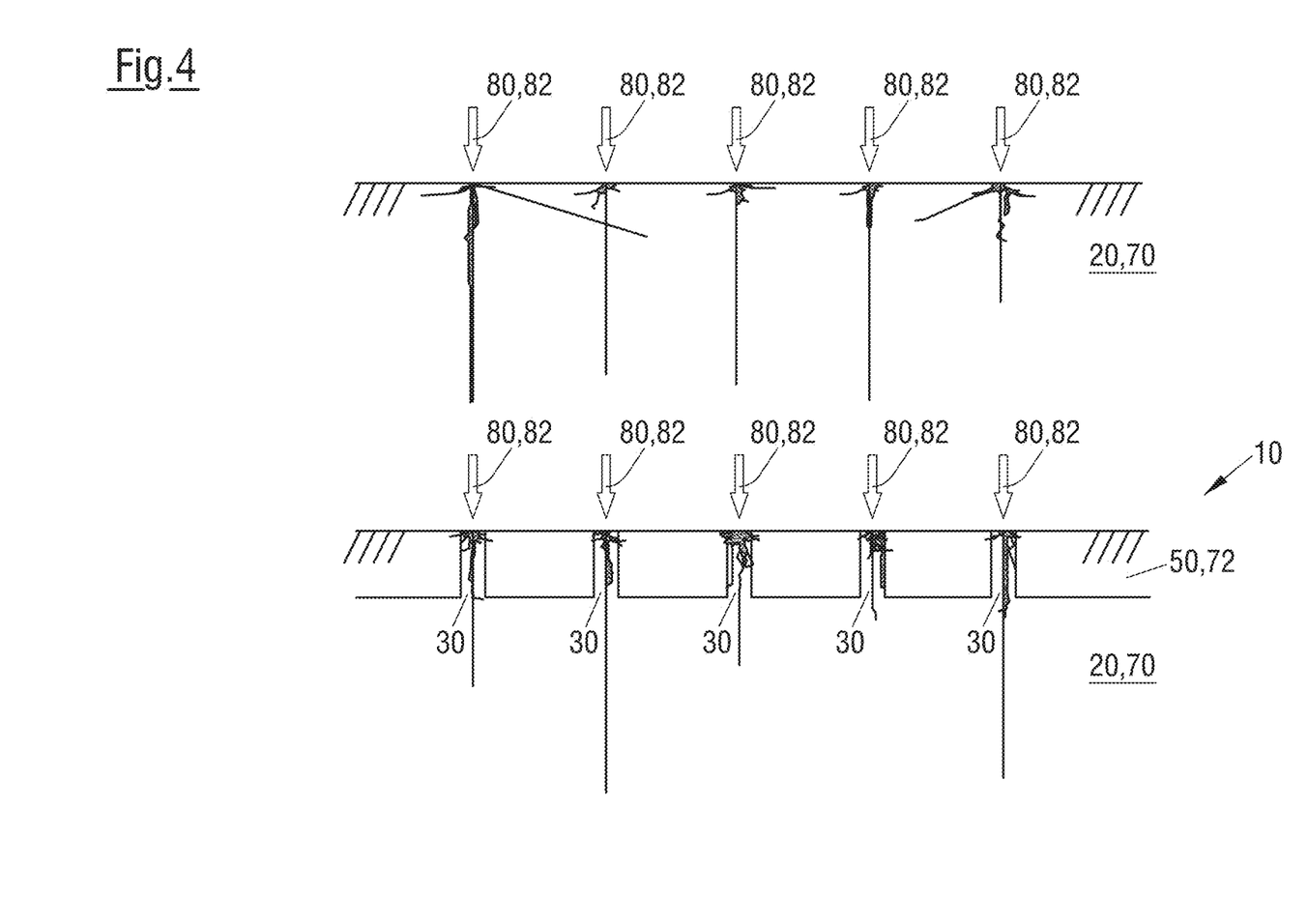
FIG. 4 different implantation reactions.

This effect is shown in FIG. 4, in which in the above row five implantation reactions of ions 80 directly into a bulk 20, in the second row five implantation reactions of ions 80 into a bulk 20 as a part of a substrate 10 according to the invention are shown. It is clearly visible that a direct implantation of the ions 80 along the implantation directions 82 directly into the bulk 20, composed of first material 70, can result in ions 80 propagating away along channels and/or planes in lateral direction as shown in the first row. In the second row, ions also start to propagate away from the implantation direction 82 along crystal panels and/or planes, but soon they leave the pillars 30 and enter the buffer layer 50 composed of the second material 72. All of these ions 80 are stopped within the buffer layer 50 and therefore cannot reach the bulk 20. A height 40 of the pillars 30 can be chosen accordingly to ensure this stopping. The ions 80 reaching the bulk 20 are predominately channelled along crystal channels and/or planes and therefore a lateral spread of these ions 80 is clearly reduced.

Figure 5:
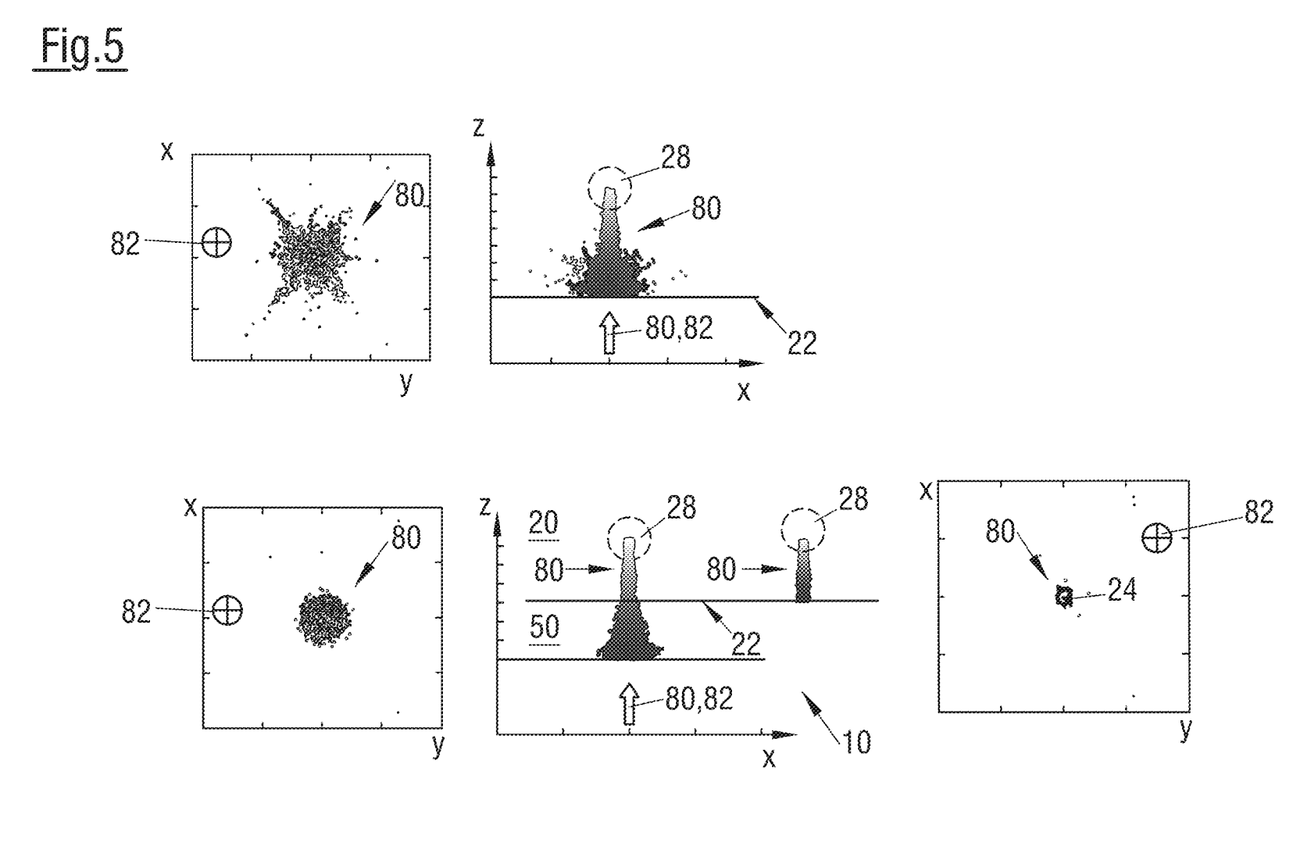

The same effect is shown in FIG. 5. All of the sub-figures of FIG. 5 show three-dimensional simulations of the spread of end points of ions 80 implanted along an implantation direction 82 into a bulk 20. The two sub-figures in the first row are based on simulations, in which only a bulk 20 was implemented, the sub-figures of the second row were calculated for a substrate 10 according to the invention. The sub-figures in the first and second column show a view along the implantation direction 82 and perpendicular to the implantation direction 82, respectively. Already this comparison shows that a lateral spread of the ions 80 is significantly reduced by using a substrate 10 according to the invention for the implantation reaction. This is especially due to the fact that in a substrate 10 according to the invention a buffer layer 50 surrounds pillars 30 (not shown) and effectively stops ion 80 leaving the pillar 30 through its sides 32 (not shown).

Additionally, in the two rightmost sub-figures of the second row, ions 80 are shown after removing the buffer layer 50, again perpendicular and along the implantation direction 82. In both projections it is clearly visible that a lateral spread perpendicular to the implantation direction 82 can be minimized by using a substrate 10 according to the invention. Ions 80 reaching the implantation region 28 can therefore be provided with high position accuracy.

Figure 6:
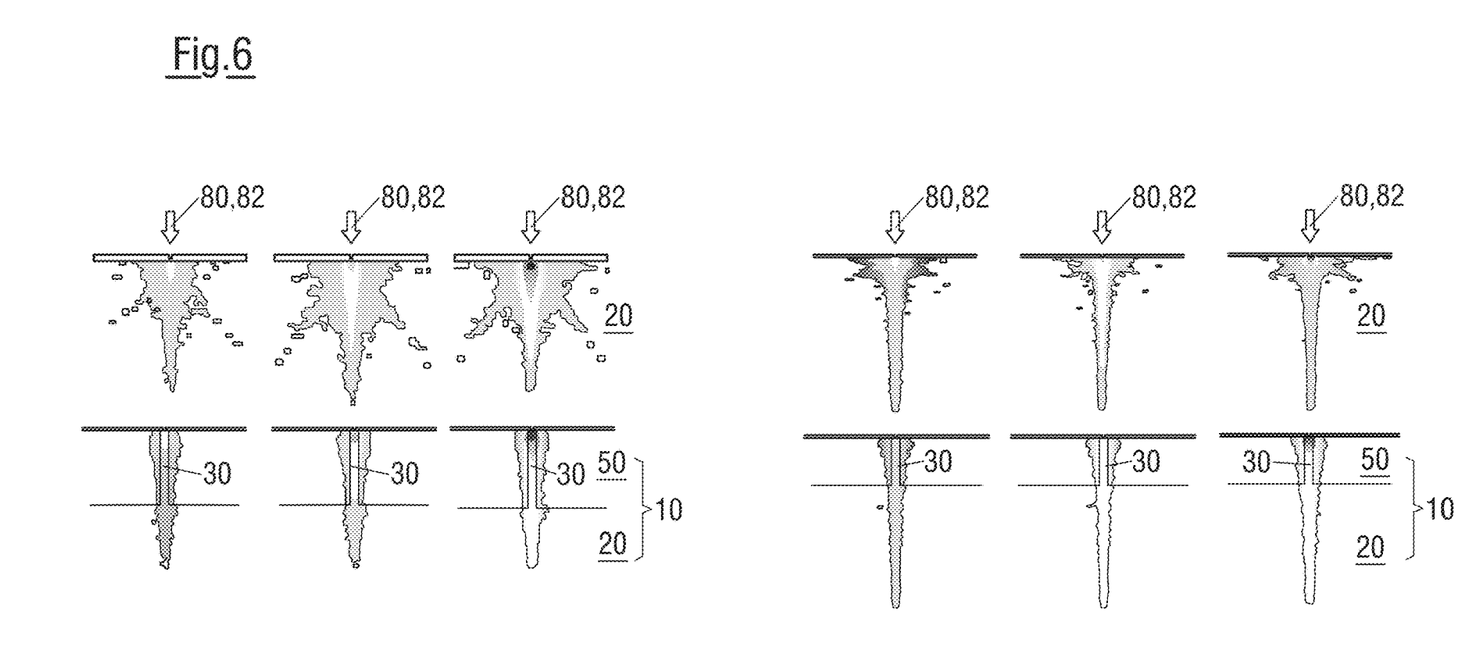
FIG. 6 comparison of simulated implantation reactions.

FIG. 6 shows comparisons of implantation reactions of ions 80 along an implantation direction 82 for different crystal orientations and numbers of ions 80. For each crystal orientation, implantation reactions with 1, 10 and 100 ions 80 are shown, respectively. Again, the first row shows a direct implantation of the ions 80 into a bulk 20, the second row shows an implantation of the ions 80 into a substrate 10 according to the invention, comprising a bulk 20, pillars 30 and a buffer layer 50. It is clearly visible that the different crystal orientations, for instance (100) silicon on the left-hand side and (110) silicon on the right-hand side, show different scattered patterns for the ions 80. Nevertheless, by using a substrate 10 according to the invention, ions 80 scattered into the buffer layer 50 can be stopped easily and only ions 80 channelled travel further in the desired direction, enter the bulk 20 and reach the desired implantation area 28 (not shown) in a channelled manner.

Figure 7:
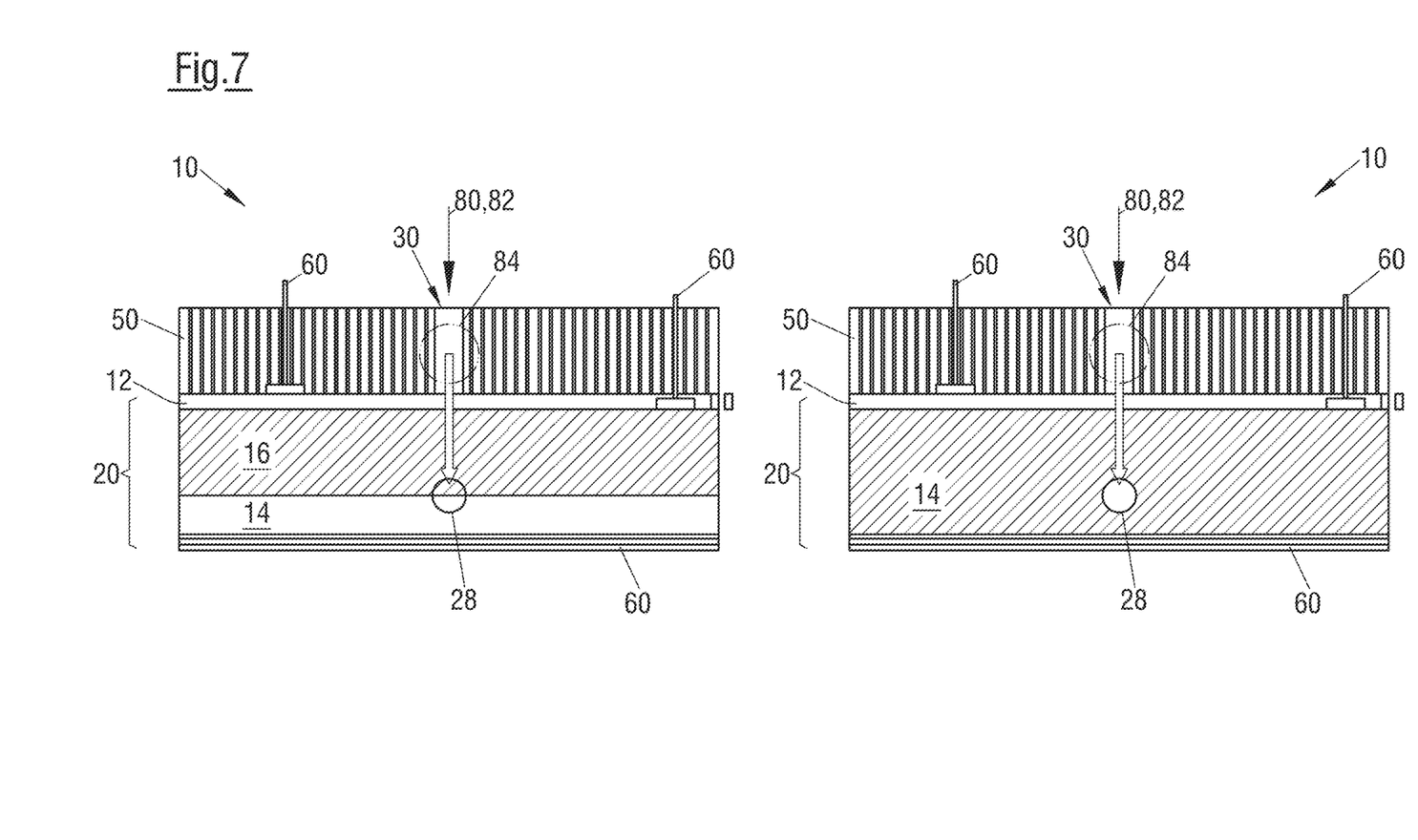
FIG. 7 registering an implantation of ions.

FIG. 7 shows preferred embodiments of substrates 10 according to the invention, both of them comprising three electric contacts 60 for a registration of implantation reactions of ions 80 into the implantation region 28. Again, the substrate 10 according to the invention comprises a bulk 20, a pillar 30 and a buffer layer 50, which surrounds the pillar 30. On the left-hand side the bulk 20 comprises an p-layer 12, a p-layer 14 and an i-layer 16 and therefore can later be used as a PIN-diode. Respectively, on the right-hand side the bulk 20 comprises only an n-layer 12 and a p-layer 14 and therefore can be used as a PN-diode. In both cases, an electric contact 60 is provided at the bottom of the bulk 20. Other contacts 60 are provided to contact the n-layer 12 and the i-layer 16 in case of the PIN-diode and the n-layer 12 and the p-layer 14 for the PN-diode shown on the right-hand side. In both cases, the implantation of an ion 80 along the implantation direction 82 into the implantation region 28 creates an electrical signal which can be registered by the electric contacts 60. A registration especially of an implantation event of a single ion 80 can therefore be provided.

Figure 8:
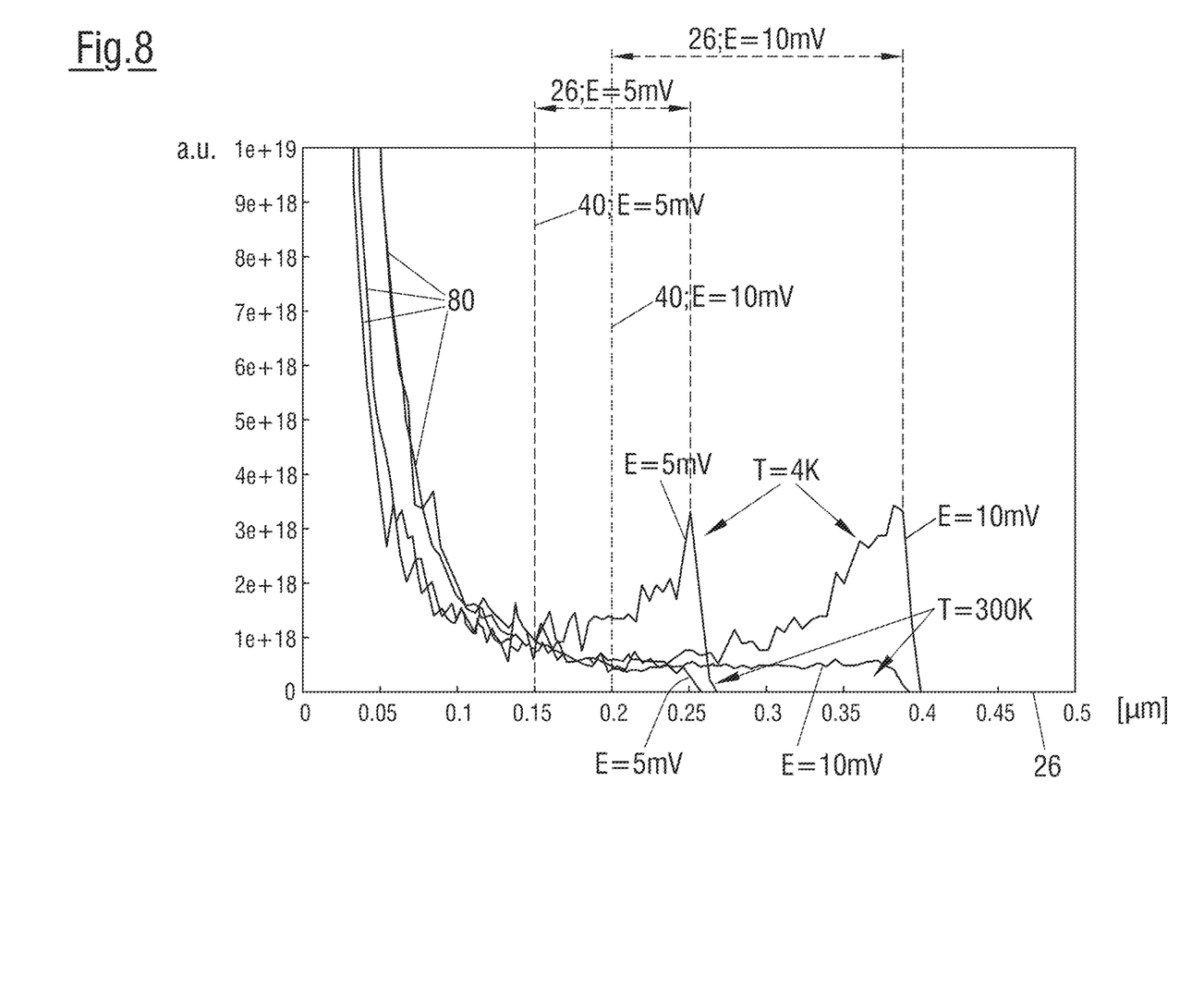
FIG. 8 temperature influence on implantation reactions.

In FIG. 8 the influence of temperatures during the implantation reactions are shown for ions 80 with different kinetic energies, namely ions 80 with kinetic energy of 5 keV and ions 80 with kinetic energy of 10 keV. The graph shows the depth at which the ions 80 are stopped. The height 40 of the respectively used pillar 30 (not shown) is also included in FIG. 8, wherein the implantation itself takes place at position 0 μm. For each kinetic energy, implantation reactions at two different temperatures are shown, namely a temperature of 300° K and a temperature of 4° K. It is clearly visible that for both kinetic energies the range of the ions 80 within the bulk 20 (not shown) is similar for the two different temperatures, wherein a stopping of the ions at lower temperatures at a maximum range is clearly enhanced. Accumulation of ions at the desired implantation depth 26 can therefore be enhanced by implanting ions 80 at low temperatures, especially at 4° C.

REFERENCE LIST 10 substrate
12 n-layer
14 p-layer
16 i-layer
20 bulk
22 surface
24 implantation area
26 implantation depth
28 implantation region
30 pillar
32 side
34 end
36 irradiation surface
38 axis
40 height
50 buffer layer
52 thickness
60 electric contact
70 first material
72 second material
80 ion
82 implantation direction
84 impact region
86 propagation direction

The invention claimed is:

1. A substrate for a controlled implantation of ions into a bulk, the substrate comprising the bulk composed of a crystalline first material, the bulk comprising an implantation region and a surface, wherein the implantation region is located within the bulk and along an implantation direction at an implantation depth below an implantation area on the surface of the bulk,
wherein the substrate further comprises a pillar composed of the first material located at the implantation area and extending opposed to the implantation direction away from the surface of the bulk, and wherein the pillar is surrounded perpendicular to the implantation direction by a buffer layer composed of a second material, the buffer layer covering the surface of the bulk and the sides of the pillar, and
wherein at least one electric contact is connected to the bulk to register an implantation of an ion into the implantation region.

2. The substrate according to claim 1,
wherein an irradiation surface of the pillar is not covered by the buffer layer, the irradiation surface being located at an end of the pillar opposed to the bulk in respect of the implantation direction.

3. The substrate according to claim 1,
wherein a crystal structure of the first material and the bulk continues in the pillar.

4. The substrate according to claim 1,
wherein the substrate comprises a plurality of pillars accordingly placed in respect of a plurality of implantation regions.

5. The substrate according to claim 1,
wherein the first material is different from the second material.

6. The substrate according to claim 1,
wherein the first material is a crystalline semiconductor.

7. The substrate according to claim 1,
wherein the second material is an amorphous material.

8. The substrate according to claim 1,
wherein the implantation area covers less than $1\times1$ µm$^2$.

9. The substrate according to claim 1,
wherein a cross section of the pillar perpendicular to the implantation direction is larger than the implantation area.

10. The substrate according to claim 1,
wherein an axis of the pillar is collinear or at least essentially.

11. The substrate according to claim 1,
wherein a height of the pillar along the implantation direction is chosen to be adapted to at least one of the following items:
first material
implantation depth
second material
material of the ions to be implanted
kinetic energy of the ions to be implanted
charge state of the ions to be implanted
mass ratio of the ions to be implanted to the first and/or second material.

12. The substrate according to claim 1,
wherein at least one ion is implanted along the implantation direction through the pillar into the implantation region.

13. The substrate according to claim 12 wherein the pillar and/or the buffer layer is removed from the surface of the bulk.

14. A method of preparing a substrate for a controlled implantation of ions into a bulk, the substrate comprising the bulk composed of a crystalline first material, the bulk comprising an implantation region and a surface, wherein the implantation region is located within the bulk and along an implantation direction at an implantation depth below an implantation area on the surface of the bulk,
the method comprising the following steps:
Providing the bulk composed of the first material;
Forming, via an etching process, a pillar of the first material located at the implantation area on the surface of the bulk composed of the first material and extending opposed to the implantation direction away from the surface of the bulk; and
Surrounding the pillar of the first material perpendicular to the implantation direction by a buffer layer composed of a second material, the buffer layer essentially covering the surface of the bulk and the sides of the pillar.

15. The method according to claim 14,
wherein after surrounding the pillar a first additional step is carried out, wherein the first additional step comprises an implantation of at least one ion into the substrate along the implantation direction through the pillar into the implantation region.

16. A method of preparing a substrate for a controlled implantation of ions into a bulk, the substrate comprising the bulk composed of a crystalline first material, the bulk comprising an implantation region and a surface, wherein the implantation region is located within the bulk and along an implantation direction at an implantation depth below an implantation area on the surface of the bulk, the method comprising the following steps:
providing the bulk composed of the first material;

forming, via an etching process, a pillar of the first material located at the implantation area on the surface of the bulk composed of the first material and extending opposed to the implantation direction away from the surface of the bulk;

surrounding the pillar of the first material perpendicular to the implantation direction by a buffer layer composed of a second material, the buffer layer essentially covering the surface of the bulk and the sides of the pillar;

implanting at least one ion into the substrate along the implantation direction through the pillar into the implantation region; and removing the buffer layer and the pillar.

17. The method according to claim 15, wherein the first additional step includes a cooling of the substrate to a temperature of at least 77° K.

18. The method according to claim 15, wherein the first additional step includes registering the implantation of ions into the implantation region.

* * * * *